United States Patent
Kikuchi et al.

(10) Patent No.: US 6,573,600 B2
(45) Date of Patent: Jun. 3, 2003

(54) MULTILAYER WIRING SUBSTRATE HAVING DIFFERENTIAL SIGNAL WIRES AND A GENERAL SIGNAL WIRE IN DIFFERENT PLANES

(75) Inventors: Atsushi Kikuchi, Kawasaki (JP); Makoto Iijima, Aizuwakamatsu (JP); Yoshihiko Ikemoto, Kawasaki (JP); Muneharu Morioka, Kawasaki (JP); Yoshiyuki Kimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 23 days.

(21) Appl. No.: 09/817,787

(22) Filed: Mar. 27, 2001

(65) Prior Publication Data
US 2002/0060366 A1 May 23, 2002

(30) Foreign Application Priority Data
Nov. 20, 2000 (JP) ........................................ 2000-353497

(51) Int. Cl.$^7$ ............................................... G01R 19/00
(52) U.S. Cl. ........................ 257/750; 257/700; 257/758; 361/794
(58) Field of Search ................................ 257/686, 700, 257/750, 758, 776; 361/792, 794, 795; 174/255–260

(56) References Cited

U.S. PATENT DOCUMENTS

| | | | | |
|---|---|---|---|---|
| 4,310,811 A | * | 1/1982 | Currie | 333/1 |
| 4,665,468 A | * | 5/1987 | Dohya | 361/414 |
| 4,685,033 A | * | 8/1987 | Inoue | 361/414 |
| 4,820,175 A | * | 4/1989 | Hasegawa et al. | 439/98 |
| 5,350,886 A | * | 9/1994 | Miyazaki et al. | 174/250 |
| 5,574,630 A | * | 11/1996 | Kresge et al. | 361/792 |
| 5,633,479 A | * | 5/1997 | Hirano | 174/255 |
| 5,757,079 A | * | 5/1998 | McAllister et al. | 257/776 |
| 6,075,211 A | * | 6/2000 | Tohya et al. | 174/255 |

FOREIGN PATENT DOCUMENTS

| | | |
|---|---|---|
| JP | 5-136567 | 6/1993 |
| JP | 9-18156 | 1/1997 |

* cited by examiner

*Primary Examiner*—Amir Zarabian
*Assistant Examiner*—Monica Lewis
(74) *Attorney, Agent, or Firm*—Armstrong, Westerman & Hattori, LLP

(57) ABSTRACT

A multilayer wiring substrate includes differential signal wires placed within a first insulating layer between a first power-supply plane and a first ground plane; and general signal wires placed within a second insulating layer between a second power-supply plane and a second ground plane. In the multilayer wiring substrate, the differential signal wires are placed in a different plane from a plane having each of the general signal wires so that the different plane includes a first area having the differential signal wires, and a second area having one of the second power-supply plane and the second ground plane. The general signal wires are placed in a vertical direction of the second area in a laminated state so that each of the general signal wires is placed between the second power-supply plane and the second ground plane.

6 Claims, 7 Drawing Sheets

MULTILAYER WIRING SUBSTRATE HAVING DIFFERENTIAL SIGNAL WIRES AND A GENERAL SIGNAL WIRE IN DIFFERENT PLANES

BACKGROUND OF THE INVENTION

1. Field of the Invention

The present invention generally relates to a semiconductor device and, more particularly, to a structure of a multilayer wiring substrate provided with differential signal wires, and a semiconductor device having such a multilayer wiring substrate and a semiconductor element mounted thereon.

In a multilayer wiring substrate, a signal layer having a signal wire is provided between a power-supply layer and a ground layer so as to match an impedance of the signal wire to reduce a crosstalk noise. A structure having the power-supply layer and the ground layer placed respectively on both sides of the signal layer is referred to as a stripline structure. A structure having the power-supply layer and the ground layer placed on one side of the signal layer is referred to as a microstripline.

2. Description of the Related Art

Japanese Laid-Open Patent Application No. 05-136567 discloses a structure in which a power-supply portion and a ground portion are placed in a same layer. In a multilayer wiring substrate disclosed in this Japanese Laid-Open Patent Application No. 05-136567, each of a power-supply wire and a ground wire is formed in a comb-like form, and tooth portions of the power-supply wire and the ground wire are interlocked one another with a predetermined distance in between so as to form a power-supply layer.

Japanese Laid-Open Patent Application No. 09-18156 discloses a structure in which power-supply wires are formed in a mesh-like form in the whole substrate. Specifically, a multilayer wiring substrate disclosed in this Japanese Laid-Open Patent Application No. 09-18156 comprises: a first layer having a first signal wiring portion, a first power-supply wiring portion, and a plurality of first ground wiring portions; and a second layer having a second signal wiring portion, a second power-supply wiring portion, and a plurality of second ground wiring portions. The second ground wiring portions of the second layer are connected to the first ground wiring portions of the first layer so that ground wires are formed in a mesh-like form in the whole multilayer wiring substrate, reducing an inductance and an impedance of the whole ground wiring portions.

As described above, by devising a structure of a power-supply portion and a ground portion of a multilayer wiring substrate, electric properties of the multilayer wiring substrate are improved. However, in a case where a wiring density of the multilayer wiring substrate is increased, and the multilayer wiring substrate is required to operate at a high-frequency band, it is difficult to match an impedance of a signal wiring portion. This makes it difficult to restrain a crosstalk noise between signal wires. Especially in a case where differential signal wires and a general signal wire are present together in a same layer, it is further difficult to match the impedance of the signal wiring portion.

Therefore, since the general signal wire and the differential signal wires provide greatly different characteristic impedances in the signal wiring portion, a portion provided with the general signal wire and a portion provided with the differential signal wires need to have different characteristic impedances. Generally, the characteristic impedance of the signal wiring portion can be changed by varying a thickness or a dielectric constant of an insulating layer in which the signal wiring portion is provided. Also, the characteristic impedance of the signal wiring portion can be changed by varying a width or a thickness of a signal wire.

At this point, although it is possible to change the over-all thickness of an insulating layer, it is difficult to change the thickness of an insulating layer partially. Additionally, it is also difficult to use different materials in one insulating layer from a practical point of view. Therefore, a width or a thickness of a wire needs to be changed so as to form a wiring layer in which wires having different impedance characteristics are present together. However, there is a disadvantage that, with wires becoming finer and finer, it is still difficult to sufficiently adjust impedance characteristics only by changing a width or a thickness of a wire.

SUMMARY OF THE INVENTION

It is a general object of the present invention to provide an improved and useful multilayer wiring substrate and a semiconductor device having the multilayer wiring substrate in which the above-mentioned problems are eliminated.

A more specific object of the present invention is to provide a multilayer wiring substrate having a power-supply portion and a ground portion arranged effectively in each layer of the multilayer wiring substrate so as to provide optimal impedance characteristics for both of a general signal wire and differential signal wires, and a semiconductor device having the multilayer wiring substrate.

In order to achieve the above-mentioned objects, there is provided according to one aspect of the present invention a multilayer wiring substrate comprising:

differential signal wires placed within a first insulating layer between a first power-supply plane and a first ground plane; and general signal wires placed within a second insulating layer between a second power-supply plane and a second ground plane, wherein the differential signal wires are placed in a different plane from a plane having each of the general signal wires so that the different plane includes a first area having the differential signal wires, and a second area having one of the second power-supply plane and the second ground plane; and the general signal wires are placed in a vertical direction of the second area in a laminated state so that each of the general signal wires is placed between the second power-supply plane and the second ground plane.

According to the present invention, since the general signal wire and the differential signal wires are placed in different planes, the distance from the general signal wire to the ground plane or the power-supply plane and the distance from the differential signal wires to the ground plane or the power-supply plane can be made different. Since an impedance regarding a signal wire depends on a distance from the signal wire to a ground plane and a distance from the signal wire to a power-supply plane, the impedance regarding the general signal wire and the impedance regarding the differential signal wires can be made different according to the distance from the general signal wire to the ground plane or the power-supply plane and the distance from the differential signal wires to the ground plane or the power-supply plane. Therefore, a multi-layer wiring substrate having both of a general signal wire and differential signal wires with a simple structure can be easily manufactured.

Additionally, the multilayer wiring substrate according to the present invention may further comprise a first plane having only the first ground plane, and a second plane having the first power-supply plane formed in a vertical direction of the first area, the second plane having the second ground plane formed in the vertical direction of the second area, wherein the differential signal wires are placed between the first ground plane and the first power-supply plane.

Additionally, the multilayer wiring substrate according to the present invention may further comprise a first plane having only the first power-supply plane, and a second plane having the first ground plane formed in a vertical direction of the first area, the second plane having the second power-supply plane formed in the vertical direction of the second area, wherein the differential signal wires are placed between the first power-supply plane and the first ground plane.

According to the present invention, the differential signal wires are placed between the first power-supply plane and the first ground plane placed in the vertical direction of the first area. On the other hand, the general signal wires are placed in the vertical direction of the second area in a laminated state so that each of the general signal wires is placed between the second power-supply plane and the second ground plane. In the plane having the differential signal wires in the first area, the second power-supply plane or the second ground plane is formed in the second area thereof. Therefore, larger numbers of the power-supply planes and the ground planes can be provided in the vertical direction of the second area having the general signal wires placed in a laminated state. Therefore, the distance from the differential signal wires to the ground plane or the power-supply plane can be made larger than the distance from the general signal wire to the ground plane or the power-supply plane.

Additionally, in the multilayer wiring substrate according to the present invention, each of the differential signal wires, the general signal wires, the first power-supply plane, the first ground plane, the second power-supply plane and the second ground plane may be made of a predetermined conductive material, and each of the first insulating layer and the second insulating layer may be made of a predetermined insulating material.

Additionally, in the multilayer wiring substrate according to the present invention, the predetermined conductive material and the predetermined insulating material may be selected so that an impedance regarding the differential signal wires becomes a predetermined value, and an impedance regarding each of the general signal wires becomes a predetermined value.

According to the present invention, the differential signal wires, the general signal wires, the power-supply planes, the ground planes and the first insulating layers can be made of appropriate materials so that impedances regarding the differential signal wires and the general signal wires, which impedances depend on properties of these materials, can be adjusted.

In order to achieve the above-mentioned objects, there is also provided according to another aspect of the present invention a semiconductor device comprising:

a multilayer wiring substrate having: differential signal wires placed within a first insulating layer between a first power-supply plane and a first ground plane; and general signal wires placed within a second insulating layer between a second power-supply plane and a second ground plane, wherein the differential signal wires are placed in a different plane from a plane having each of the general signal wires so that the different plane includes a first area having the differential signal wires, and a second area having one of the second power-supply plane and the second ground plane; and the general signal wires are placed in a vertical direction of the second area in a laminated state so that each of the general signal wires is placed between the second power-supply plane and the second ground plane; and a semiconductor element mounted on the multilayer wiring substrate.

According to the present invention, since the general signal wire and the differential signal wires are placed in different planes, the distance from the general signal wire to the ground plane or the power-supply plane and the distance from the differential signal wires to the ground plane or the power-supply plane can be made different. Since an impedance regarding a signal wire depends on a distance from the signal wire to a ground plane and a distance from the signal wire to a power-supply plane, the impedance regarding the general signal wire and the impedance regarding the differential signal wires can be made different according to the distance from the general signal wire to the ground plane or the power-supply plane and the distance from the differential signal wires to the ground plane or the power-supply plane. Therefore, a multi-layer wiring substrate having both of a general signal wire and differential signal wires with a simple structure can be easily manufactured. Additionally, with the multi-layer wiring substrate, a semiconductor device requiring a fine wiring structure can be easily manufactured.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 1:
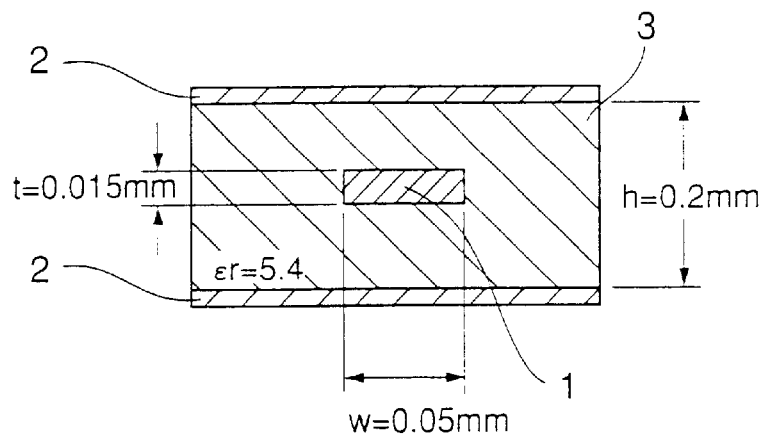
FIG. 1 is a cross-sectional view of a stripline structure regarding a general signal wire.
Figure 2:
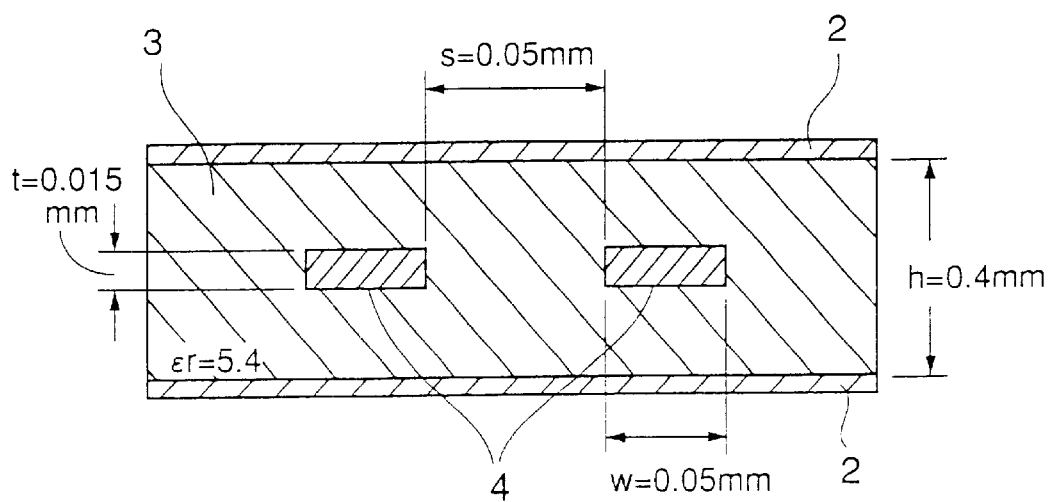
FIG. 2 is a cross-sectional view of a stripline structure regarding differential signal wires.

FIG. 1 is a cross-sectional view of a stripline structure regarding a general signal wire. FIG. 2 is a cross-sectional view of a stripline structure regarding differential signal wires.

In the stripline structure shown in FIG. 1, a general signal wire 1 is placed at the center of an insulating layer 3 formed of glass-ceramic, etc. On one side of the insulating layer 3 is placed a ground plane (a ground layer) or a power-supply plane (a power-supply layer) 2. Also, on the other side of the insulating layer 3 is placed the ground plane (the ground layer) or the power-supply plane (the power-supply layer) 2. In other words, the general signal wire 1 is placed between the two ground planes 2, between the two power-supply planes 2, or between the ground plane 2 and the power-supply plane 2 via an insulating material of the insulating layer 3.

In FIG. 1, the general signal wire 1 has a width w of 0.05 mm and a thickness t of 0.015 mm. A dielectric constant $\in r$ is 5.4 in a case where the insulating layer 3 is formed of glass-ceramic. A distance between the two power-supply or ground planes 2, i.e., a thickness h of the insulating layer 3, is 0.2 mm.

In the stripline structure shown in FIG. 1, a characteristic impedance regarding the general signal wire 1 can be obtained by the following expression.

$$Z0=60/(\in r)^{1/2} \times ln(1.9h/(0.8w+t))$$

Each value in the above expression is determined so that the characteristic impedance regarding the general signal wire 1 becomes normally 50Ω(Z0=50Ω).

On the other hand, the stripline structure shown in FIG. 2 regards differential signal wires, and the differential signal wires comprise a pair of signal wires 4. Hereinafter, a pair of the signal wires 4 are referred to as differential signal wires 4.

In the stripline structure shown in FIG. 2, the differential signal wires 4 are placed at the center of the insulating layer 3 formed of glass-ceramic, etc., as in the stripline structure shown in FIG. 1. On one side of the insulating layer 3 is placed the ground plane (the ground layer) or the power-supply plane (the power-supply layer) 2. Also, on the other side of the insulating layer 3 is placed the ground plane (the ground layer) or the power-supply plane (the power-supply layer) 2. In other words, the differential signal wires 4 are placed between the two ground planes 2, between the two power-supply planes 2, or between the ground plane 2 and the power-supply plane 2 via the insulating material of the insulating layer 3.

In FIG. 2, each of the differential signal wires 4 has a width w of 0.05 mm and a thickness t of 0.015 mm. A dielectric constant $\in r$ is 5.4 in a case where the insulating layer 3 is formed of glass-ceramic. A distance between the two power-supply or ground planes 2, i.e., a thickness h of the insulating layer 3, is 0.4 mm.

In the stripline structure shown in FIG. 2, a differential impedance regarding the differential signal wires 4 can be obtained by the following expression.

$$Zdiff=2Z0(1-0.374e^{-2.9s/h})$$

Each value in the above expression is determined so that the differential impedance regarding the differential signal wires 4 becomes normally 100Ω (Zdiff=100Ω). In the example shown in FIG. 2, the differential impedance is calculated by the above expression, giving Zdiff=100.3Ω. In addition, a differential impedance Z0 regarding each of the differential signal wires 4 is calculated by the earlier-mentioned expression regarding the general signal wire 1, giving Z0=67.8Ω.

Comparing FIGS. 1 and 2, the thickness h (0.4 mm) of the insulating layer 3 used for insulating the differential signal wires 4 is double the thickness h (0.2 mm) of the insulating layer 3 used for insulating the general signal wire 1. In the present embodiment, a multilayer wiring substrate is structured so that the thickness of the insulating layer 3 for the differential signal wires 4 is double the thickness of the insulating layer 3 for the general signal wire 1. Thereby, optimal impedance characteristics can be provided for both of the general signal wire and the differential signal wires.

Figure 3:
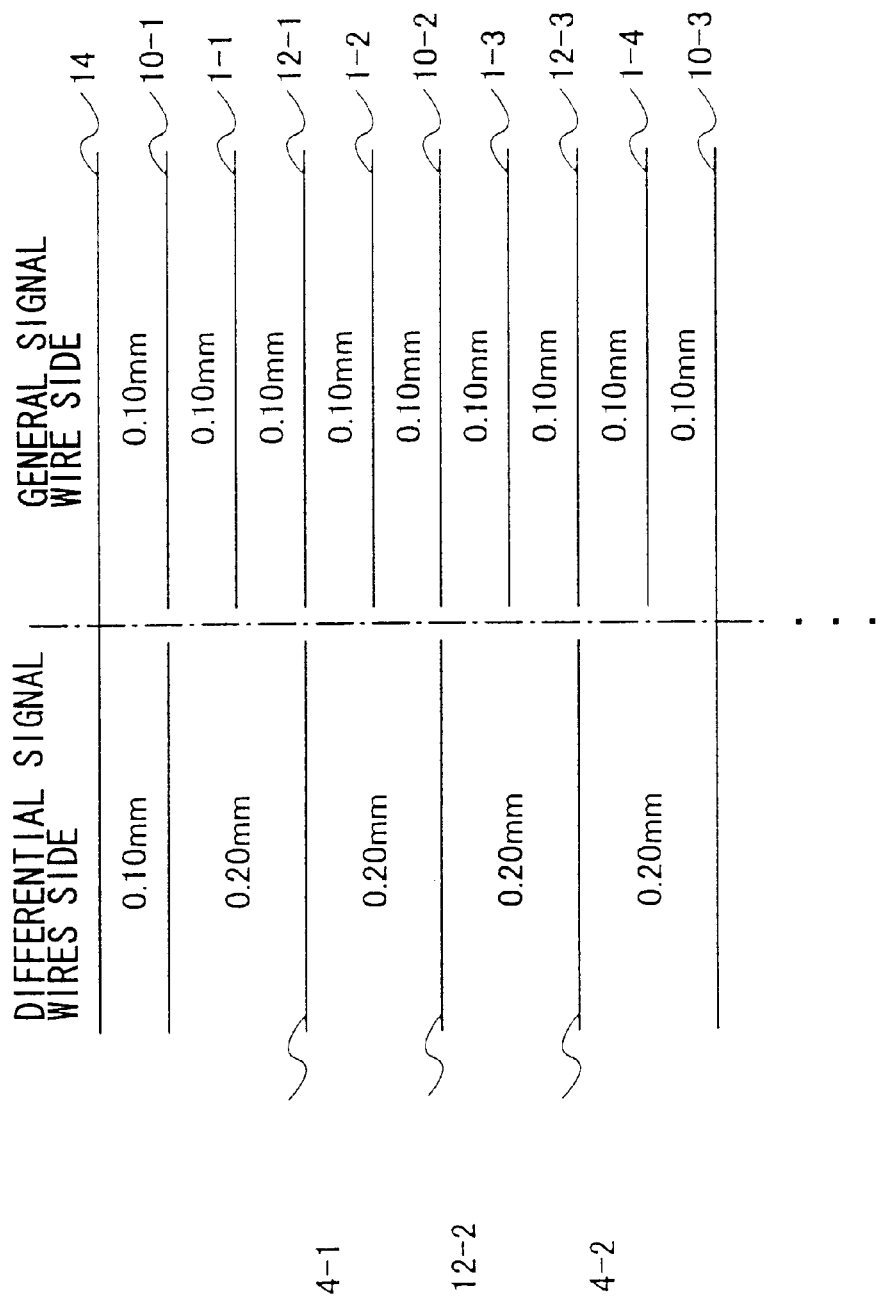
FIG. 3 is an illustration for explaining a multilayer structure of a multilayer wiring substrate according to an embodiment of the present invention.
Figure 4:
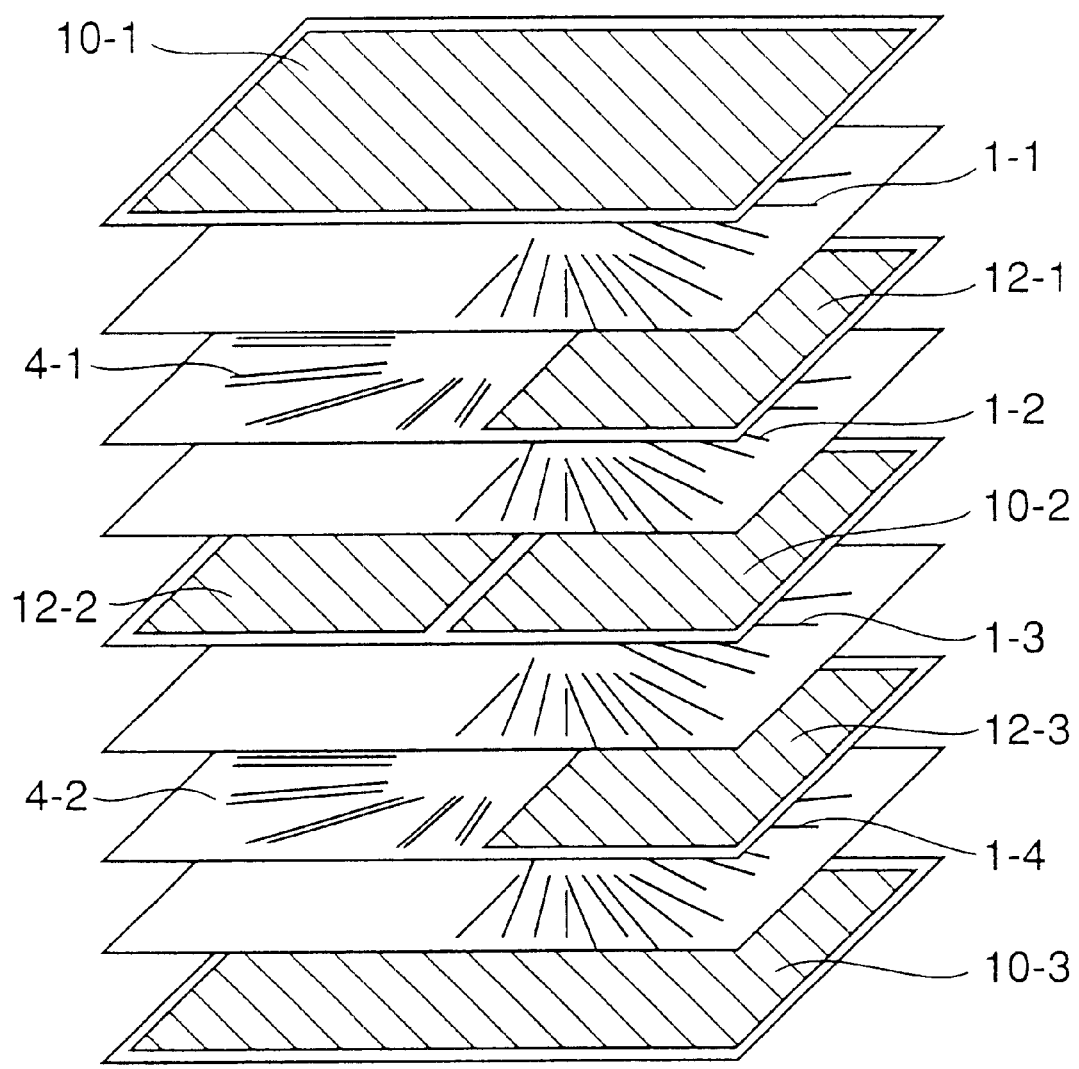
FIG. 4 is a three-dimensional illustration of the multilayer structure shown in FIG. 3.

Next, a description will be given, with reference to FIGS. 3 and 4, of an embodiment according to the present invention. FIG. 3 is an illustration for explaining a multilayer structure of a multilayer wiring substrate according to the present embodiment. FIG. 4 is a three-dimensional illustration of the multilayer structure shown in FIG. 3.

The multilayer wiring substrate according to the present embodiment has both of the general signal wire 1 and the differential signal wires 4 in a substrate. The general signal wire 1 and the differential signal wires 4 are formed in different layers (or planes). In addition, the multilayer wiring substrate is, as seen from above, divided into an area provided with the general signal wire 1 and an area provided with the differential signal wires 4. Specifically, in the example shown in FIG. 3, the differential signal wires 4 are provided on the left side (a side of the differential signal wires (a first area)) of the multilayer wiring substrate, and the general signal wire 1 is provided on the right side (a side of the general signal wire (a second area)) of the multilayer wiring substrate.

In FIG. 3, an upper ground plane (a GND plane) 10-1 is formed all along a surface 14 of the multilayer wiring substrate. Under the ground plane 10-1 and on the side of the general signal wire is provided a plane having a general signal wire 1-1 formed thereon via an insulating layer having a thickness of 0.10 mm. The general signal wire 1-1 is formed only on the side of the general signal wire, not on the side of the differential signal wires. Under the plane having the general signal wire 1-1 is provided a power-supply plane 12-1 via an insulating layer having a thickness of 0.10 mm.

In a plane having the power-supply plane 12-1 and on the side of the differential signal wires are formed differential signal wires 4-1. That is, the power-supply plane 12-1 is formed only on the side of the general signal wire, and the differential signal wires 4-1 are formed on the side of the differential signal wires in the same plane as the power-supply plane 12-1. Accordingly, between the ground plane 10-1 and the differential signal wires 4-1 is provided an insulating layer having a thickness of 0.20 mm.

Under the power-supply plane 12-1 is provided a plane having a general signal wire 1-2 formed thereon via an insulating layer having a thickness of 0.10 mm. The general signal wire 1-2 is formed only on the side of the general signal wire, not on the side of the differential signal wires. Under the plane having the general signal wire 1-2 is formed a ground plane 10-2 via an insulating layer having a thickness of 0.10 mm. The ground plane 10-2 is formed only on the side of the general signal wire, and a power-supply plane 12-2 is provided on the side of the differential signal wires in the same plane as the ground plane 10-2. In other words, the ground plane 10-2 and the power-supply plane 12-2 are provided in the same plane, with the ground plane 10-2 on the side of the general signal wire and the power-supply plane 12-2 on the side of the differential signal wires.

Accordingly, between the differential signal wires 4-1 and the power-supply plane 12-2 is provided an insulating layer having a thickness of 0.20 mm.

In the same manner as the above-mentioned structure, under the ground plane 10-2 is provided a plane having a general signal wire 1-3 formed thereon via an insulating layer having a thickness of 0.10 mm. The general signal wire 1-3 is formed only on the side of the general signal wire, not on the side of the differential signal wires. Under the plane having the general signal wire 1-3 is provided a power-supply plane 12-3 via an insulating layer having a thickness of 0.10 mm.

In a plane having the power-supply plane 12-3 and on the side of the differential signal wires are formed differential signal wires 4-2. That is, the power-supply plane 12-3 is formed only on the side of the general signal wire, and the differential signal wires 4-2 are formed on the side of the differential signal wires in the same plane as the power-supply plane 12-3. Accordingly, between the ground plane 10-2 and the differential signal wires 4-2 is provided an insulating layer having a thickness of 0.20 mm.

Under the power-supply plane 12-3 is provided a plane having a general signal wire 1-4 formed thereon via an insulating layer having a thickness of 0.10 mm. The general signal wire 1-4 is formed only on the side of the general signal wire, not on the side of the differential signal wires. Under the plane having the general signal wire 1-4 is formed a ground plane 10-3 via an insulating layer having a thickness of 0.10 mm. The ground plane 10-3 is not only formed on the side of the general signal wire, but is extended also onto the side of the differential signal wires in the same plane. Accordingly, between the differential signal wires 4-2 and the ground plane 10-3 is provided an insulating layer having a thickness of 0.20 mm.

In the present embodiment, more ground planes 10, more power-supply planes 12, more general signal wires 1 and more differential signal wires 4 can be provided in the above-described manner so as to provide a larger number of layers. Additionally, above the upper ground plane 10-1 is provided the surface 14 via an insulating layer having a thickness of 0.10 mm. It is noted that the surface 14 above the upper ground plane 10-1 is not shown in FIG. 4.

In addition, the multilayer wiring substrate according to the present embodiment can be formed as a multilayer wiring substrate having the differential signal wires and the general signal wire present together, by having only one layer structure including the surface 14, the ground plane 10-1, the general signal wire 1-1, the power-supply plane 12-1, the differential signal wires 4-1, the general signal wire 1-2, the ground plane 10-2 and the power-supply plane 12-2.

According to the above-mentioned embodiment, the insulating layers having a thickness of 0.10 mm are provided above and under the general signal wires 1-1, 1-2, 1-3 and 1-4. On the other hand, the insulating layers having a thickness of 0.20 mm are provided above and under the differential signal wires 4-1 and 4-2. Each of the general signal wires 1-1, 1-2, 1-3, 1-4 and the differential signal wires 4-1 and 4-2 is placed between the corresponding ground plane and the corresponding power-supply plane.

Accordingly, in the multilayer structure shown in FIGS. 3 and 4, the thickness of the insulating layers for the differential signal wires 4 is double the thickness of the insulating layers for the general signal wires 1, as described with reference to FIGS. 1 and 2. Thereby, optimal impedance characteristics can be provided for both of the general signal wire and the differential signal wires. The insulating layer for the differential signal wires 4 is formed simply by placing one of the insulating layers having a thickness of 0.10 mm used for the general signal wire 1 on the other. Therefore, only with the simple structure, the thickness of the insulating layer for the differential signal wires 4 can be made twice as large as the thickness of the insulating layer for the general signal wire 1.

As described above, in the multilayer wiring substrate according to the present invention, the general signal wire 1 and the differential signal wires 4 are placed in different planes, and the plane including the differential signal wires 4 has the first area on which the differential signal wires 4 are placed, and the second area on which either of the power-supply plane or the ground plane is placed. Each of the general signal wires 1 is placed between the power-supply plane and the ground plane, and thus the general signal wires 1 are placed in a vertical direction in a laminated state.

Additionally, the above-described multilayer wiring substrate according to the present invention may comprise a first plane having only the ground plane; and a second plane having the power-supply plane formed on the first area, and the ground plane formed on the second area, wherein the differential signal wires 4 are placed between the ground plane formed on the first plane and the power-supply plane formed on the second plane. The power-supply planes are formed in a vertical direction in a space defined by the first area being extended in a perpendicular direction to the second plane. The same goes for the ground planes formed on the second area of the second plane.

Additionally, the above-described multilayer wiring substrate according to the present invention may comprise a first plane having only the power-supply plane; and a second plane having the ground plane formed on the first area, and the power-supply plane formed on the second area, wherein the differential signal wires 4 are placed between the power-supply plane formed on the first plane and the ground plane formed on the second plane. The ground planes are formed in a vertical direction in a space defined by the first area being extended in a perpendicular direction to the second plane. The same goes for the power-supply planes formed on the second area of the second plane.

Next, a description will be given, with reference to the drawings, of a semiconductor device using the multilayer wiring substrate according to the above-described embodiment.

Figure 5:
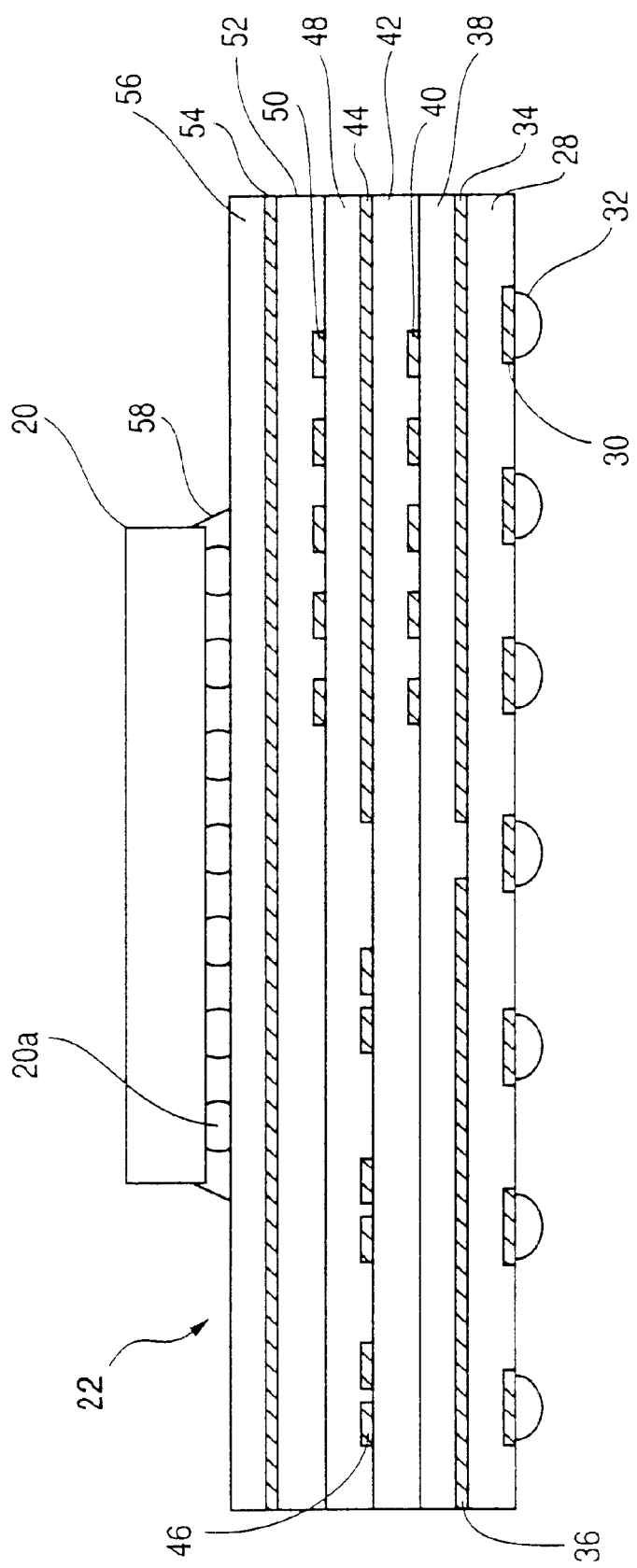
FIG. 5 is a cross-sectional view of a first example of a semiconductor device formed by using the multilayer wiring substrate according to the embodiment of the present invention.

FIG. 5 is a cross-sectional view of a first example of a semiconductor device formed by using the multilayer wiring substrate according to the above-described embodiment. The semiconductor device shown in FIG. 5 is formed by mounting a semiconductor element 20 on a multilayer wiring substrate 22 by flip chip mounting.

The multilayer wiring substrate 22 has a structure equivalent to the structure encompassing the surface 14 to the ground plane 10-2 (the power-supply plane 12-2) of the multilayer structure shown in FIG. 3. Therefore, the multilayer wiring substrate 22 has one layer of the differential signal wires; and two layers of the general signal wire.

The undermost layer of the multilayer wiring substrate 22 is an insulating layer 28. External connection electrodes 30 are formed on the undersurface of the insulating layer 28. A solder ball 32 is formed on each of the external connection electrodes 30, and functions as an external connection terminal of the semiconductor device.

A ground plane 34 is formed on a part (the right half in FIG. 5) of the upper surface of the insulating layer 28. A power-supply plane 36 is formed on the other part (the left half in FIG. 5) of the upper surface of the insulating layer 28.

An insulating layer 38 is provided on the ground plane 34 and the power-supply plane 36. A general signal wire 40 is formed on the insulating layer 38 above the ground plane 34. However, neither a general signal wire nor differential signal wires are formed on the insulating layer 38 above the power-supply plane 36.

Further, an insulating layer 42 is formed on the general signal wire 40 and the insulating layer 38. Therefore, the general signal wire 40 is placed between the insulating layer 38 and the insulating layer 42.

A power-supply plane 44 is formed on the upper surface of the insulating layer 42 above an area on which the general signal wire 40 is provided. Differential signal wires 46 are formed on the upper surface of the insulating layer 42 above an area on which the general signal wire 40 is not provided. Therefore, the differential signal wires 46 are formed on a part of the upper surface of the insulating layer 42, and the power-supply plane 44 is formed on the other part of the upper surface of the insulating layer 42. That is, both of the differential signal wires 46 and the power-supply plane 44 are formed on the upper surface of the insulating layer 42.

Further, an insulating layer 48 is formed on the power-supply plane 44 and the differential signal wires 46 (i.e., on the insulating layer 42). A general signal wire 50 is formed on the upper surface of the insulating layer 48 above the power-supply plane 44. However, neither a general signal wire nor differential signal wires are formed on the upper surface of the insulating layer 48 above the differential signal wires 46.

Further, an insulating layer 52 is formed on the general signal wire 50 (i.e., on the insulating layer 48). Therefore, the general signal wire 50 is placed between the insulating layer 48 and the insulating layer 52.

A ground plane 54 is formed all over the upper surface of the insulating layer 52. An insulating layer 56 is formed on the upper surface of the ground plane 54. The insulating layer 56 is the uppermost layer of the multilayer wiring substrate 22. On the upper surface of the insulating layer 56 are formed electrodes (not shown in the figures) used for mounting a semiconductor element.

In this structure, the insulating layers 38, 42, 48 and 52 are formed of glass-ceramic, etc., and have substantially a same thickness. The insulating layers 38, 42, 48 and 52 may be formed of not only an inorganic material, such as glass-ceramic, but also an organic material, such as resin. In addition, the general signal wire, the differential signal wires, the power-supply plane and the ground plane are formed of a conductive material, such as tungsten or copper.

In addition, the electrodes of the multilayer wiring substrate 22, the differential signal wires, the general signal wires, the ground planes and the power-supply planes are electrically connected by circuit patterns and via holes formed in each layer so that the semiconductor device has predetermined functions. Such an inter-layer electric connection is a well-known technique for a person skilled in the art, and will not be depicted in the figures nor described in detail.

The semiconductor element 20 is mounted on the electrodes formed on the insulating layer 56 of the multilayer wiring substrate 22 by flip chip mounting, using a solder bump 20a. Thereafter, an underfill resin 58 is applied between the semiconductor element 20 and the insulating layer 56 of the multilayer wiring substrate 22 so as to complete the semiconductor device.

As shown in FIG. 5, the power-supply plane 36 is formed below the differential signal wires 46 via the insulating layer 42 and the insulating layer 38. Above the differential signal wires 46 are formed the ground plane 54 via the insulating layer 48 and the insulating layer 52. Therefore, the total thickness of the insulating layers 42, 38, 48 and 52 for the differential signal wires 46 is double the total thickness of the insulating layers 42 and 38 (or 48 and 52) for one of the general signal wires 40 and 50. Hence, optimal impedance characteristics can be provided for each of the differential signal wires 46 and the general signal wires 40 and 50.

Figure 6:
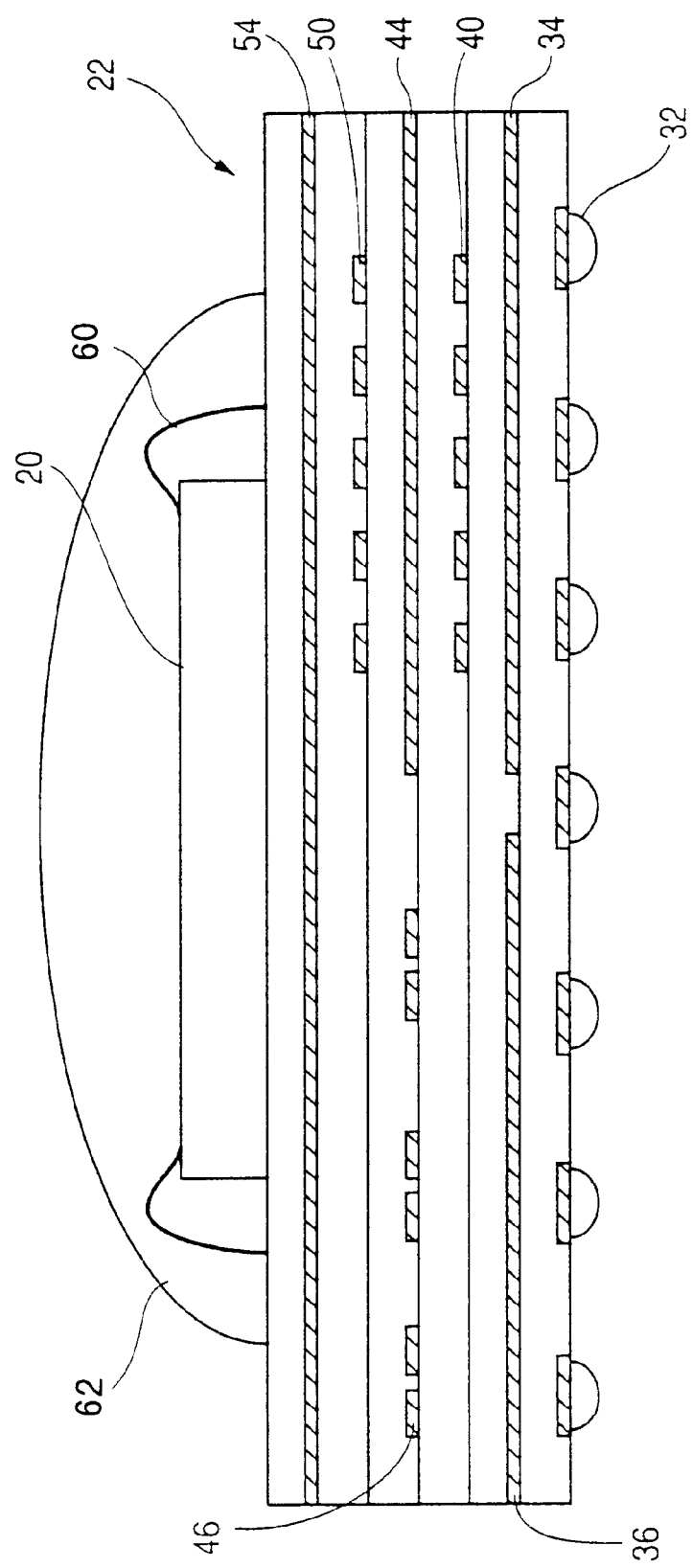
FIG. 6 is a cross-sectional view of a second example of a semiconductor device formed by using the multilayer wiring substrate according to the embodiment of the present invention.

FIG. 6 is a cross-sectional view of a second example of a semiconductor device formed by using the multilayer wiring substrate according to the above-described embodiment. Elements in FIG. 6 that are identical or equivalent to the elements shown in FIG. 5 are referenced by the same reference marks, and will not be described in detail. The semiconductor device shown in FIG. 6 is formed by mounting the semiconductor element 20 on the multilayer wiring substrate 22 by wire bonding.

Specifically, the backside of the semiconductor element 20 is fixed on the multilayer wiring substrate 22 shown in FIG. 5, and then each of electrodes of the semiconductor element 20 and the corresponding electrode of the multilayer wiring substrate 22 are electrically connected by a bonding wire 60. The semiconductor element 20 and the bonding wire 60 are sealed by a potting resin 62.

Figure 7:
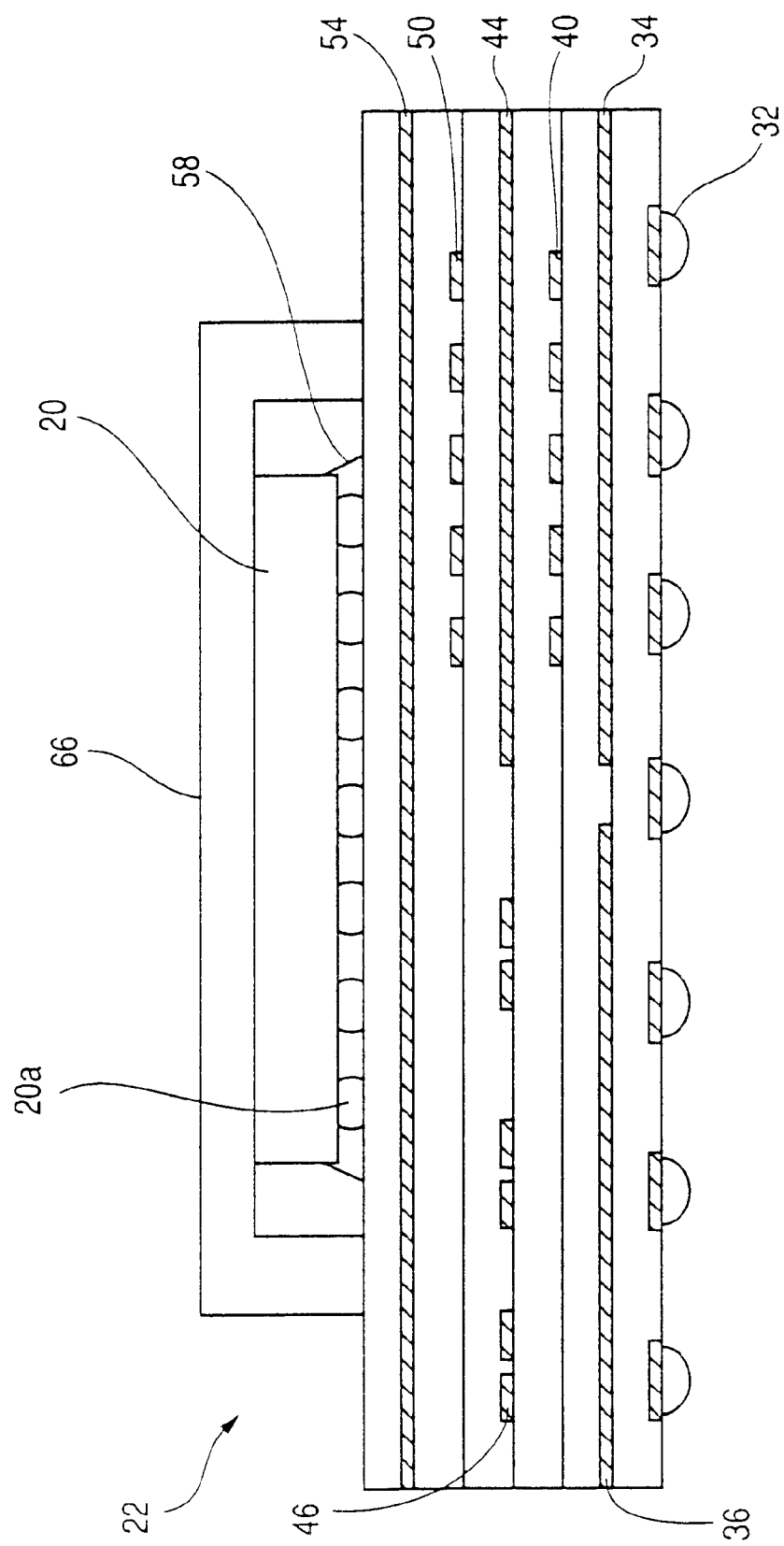
FIG. 7 is a cross-sectional view of a third example of a semiconductor device formed by using the multilayer wiring substrate according to the embodiment of the present invention.

FIG. 7 is a cross-sectional view of a third example of a semiconductor device formed by using the multilayer wiring substrate according to the above-described embodiment. Elements in FIG. 7 that are identical or equivalent to the elements shown in FIG. 5 are referenced by the same reference marks, and will not be described in detail.

The semiconductor device shown in FIG. 7 is formed by mounting the semiconductor element 20 on the multilayer wiring substrate 22 by flip chip mounting, and by further providing a heat spreader 66 used for a heat radiation. The heat spreader 66 has a cavity accommodating the semiconductor element 20, and contacts the backside of the semiconductor element 20 so as to spread away a heat of the semiconductor element 20.

Figure 8:
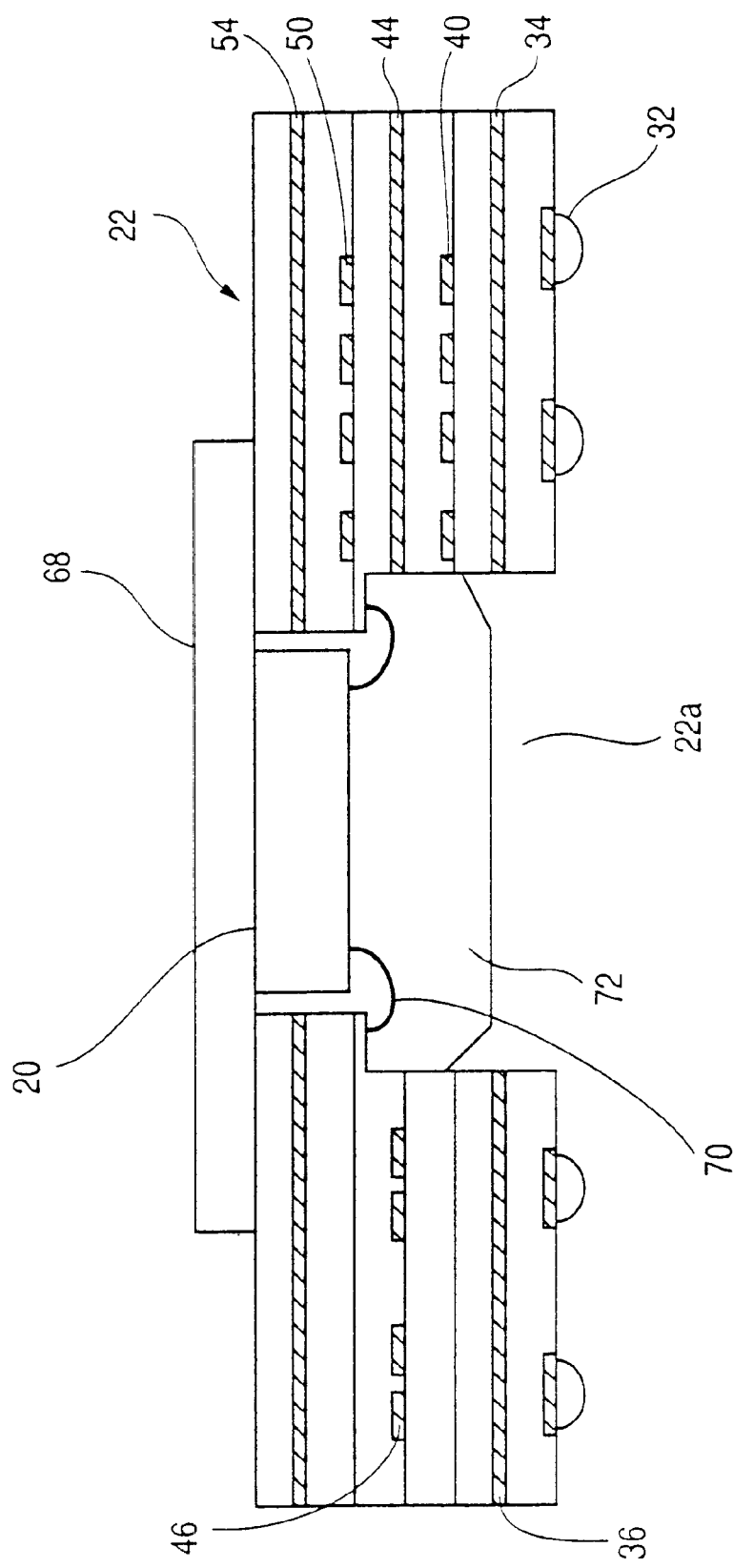
FIG. 8 is a cross-sectional view of a fourth example of a semiconductor device formed by using the multilayer wiring substrate according to the embodiment of the present invention.

FIG. 8 is a cross-sectional view of a fourth example of a semiconductor device formed by using the multilayer wiring substrate according to the above-described embodiment. Elements in FIG. 8 that are identical or equivalent to the elements shown in FIG. 5 are referenced by the same reference marks, and will not be described in detail.

The semiconductor device shown in FIG. 8 comprises an opening 22a formed beforehand in the multilayer wiring substrate 22; and the semiconductor element 20 contained therein. Specifically, a heat spreader 68 is fixed on the insulating layer 56, i.e., the uppermost layer of the multilayer wiring substrate 22, so as to cover the upper end of the opening 22a. Then, in the opening 22a, the backside of the semiconductor element 20 is fixed on a surface of the heat spreader 68 exposed to the opening 22a.

The inner surface of the opening 22a is not flat, but has an inverted stage therein. Each of the electrodes of the semiconductor element 20 is electrically connected to an electrode (not shown in the figures) formed on the inverted stage by a bonding wire 70. Thereafter, the semiconductor element 20 and the bonding wire 70 in the opening 22a are sealed by a potting resin 72 so as to complete the semiconductor device.

The present invention is not limited to the specifically disclosed embodiments, and variations and modifications may be made without departing from the scope of the present invention.

The present application is based on Japanese priority application No. 2000-353497 filed on Nov. 20, 2000, the entire contents of which are hereby incorporated by reference.

What is claimed is:

1. A multilayer wiring substrate comprising:

differential signal wires placed within a first insulating layer between a first power-supply plane and a first ground plane, said differential signal wires configured to achieve a predetermined differential impedance; and general signal wires placed within a second insulating layer between a second power-supply plane and a second ground plane, said general signal wires configured to achieve a predetermined characteristic impedance, wherein said differential signal wires are placed in a different plane from a plane having each of said general signal wires so that said different plane includes a first area having said differential signal wires, and a second area having one of said second power-supply plane and said second ground plane; and said general signal wires are placed in a vertical direction of said second area in a laminated state so that each of said general signal wires is placed between said second power-supply plane and said second ground plane.

2. The multilayer wiring substrate as claimed in claim 1, further comprising a first plane having only said first ground plane, and a second plane having said first power-supply plane formed in a vertical direction of said first area, said second plane having said second ground plane formed in the vertical direction of said second area, wherein said differential signal wires are placed between said first ground plane and said first power-supply plane.

3. The multilayer wiring substrate as claimed in claim 1, further comprising a first plane having only said first power-supply plane, and a second plane having said first ground plane formed in a vertical direction of said first area, said second plane having said second power-supply plane formed in the vertical direction of said second area, wherein said differential signal wires are placed between said first power-supply plane and said first ground plane.

4. The multilayer wiring substrate as claimed in claim 1, wherein each of said differential signal wires, said general signal wires, said first power-supply plane, said first ground plane, said second power-supply plane and said second ground plane is made of a predetermined conductive material, and each of said first insulating layer and said second insulating layer is made of a predetermined insulating material.

5. The multilayer wiring substrate as claimed in claim 4, wherein said predetermined conductive material and said predetermined insulating material are selected so that an impedance regarding said differential signal wires becomes a predetermined value, and an impedance regarding each of said general signal wires becomes a predetermined value.

6. A semiconductor device comprising:

a multilayer wiring substrate having:

differential signal wires placed within a first insulating layer between a first power-supply plane and a first ground plane, said differential signal wires configured to achieve a predetermined differential impedance; and general signal wires placed within a second insulating layer between a second power-supply plane and a second ground plane, said general signal wires configured to achieve a predetermined characteristic impedance, wherein said differential signal wires are placed in a different plane from a plane having each of said general signal wires so that said different plane includes a first area having said differential signal wires, and a second area having one of said second power-supply plane and said second ground plane; and said general signal wires are placed in a vertical direction of said second area in a laminated state so that each of said general signal wires is placed between said second power-supply plane and said second ground plane; and a semiconductor element mounted on said multilayer wiring substrate.

* * * * *